United States Patent [19]

Salim

[11] Patent Number: 4,749,853
[45] Date of Patent: Jun. 7, 1988

[54] LIGHT BARRIER HAVING MULTIPLEXER FOR ACTUATING TRANSCEIVER PAIRS AND MULTIPLE CHANNEL OPERATION

[75] Inventor: Ehsan Salim, Losone, Switzerland

[73] Assignee: AG fur Industrielle Elektronik AGIE Losone bi Locarno, Losone, Switzerland

[21] Appl. No.: 5,677

[22] Filed: Jan. 20, 1987

[30] Foreign Application Priority Data

Jan. 20, 1986 [DE] Fed. Rep. of Germany ....... 3601516

[51] Int. Cl.⁴ ............................................. G01V 9/04
[52] U.S. Cl. ..................................... 250/221; 340/555
[58] Field of Search ............................ 250/221, 222.1; 340/555, 556; 455/607, 608

[56] References Cited

U.S. PATENT DOCUMENTS

| | | | |
|---|---|---|---|
| 4,266,124 | 5/1981 | Weber et al. | 250/221 |
| 4,313,109 | 1/1982 | Funk et al. | 250/221 |
| 4,520,262 | 5/1985 | Denion | 250/221 |
| 4,650,990 | 3/1987 | Jönsson | 340/555 |
| 4,672,195 | 6/1987 | Golborne et al. | 250/222.1 |

Primary Examiner—David C. Nelms
Assistant Examiner—William L. Oen
Attorney, Agent, or Firm—Helfgott & Karas

[57] ABSTRACT

An evaluation circuit for use with electronic system which utilizes a plurality of individual transmitters of light, a like plurality of individual receivers of light, and a like plurality of light conducting paths. Each transmitter is connected to its corresponding receiver by a corresponding path so that the light emitted by any transmitter can only impinge upon the corresponding receiver. The light emitted is in the form of pulses. The transmitters are selectively actuated and deactuated in selected format by a multiplexer. The corresponding receivers are synchronized to respond in the same format by a demultiplexer whereby when the system functions properly each receiver will receive and respond only to the light pulse emitted by the corresponding transmitter. In the circuit, a measuring operation is initiated in which each transmitter-receiver pair is individually actuated in a selected sequence. A first channel produces a first signal when each receiver has properly received a light pulse emitted by its corresponding transmitter, the first signal suddenly changing value whenever a receiver fails to receive a light pulse emitted by its corresponding transmitter.

10 Claims, 6 Drawing Sheets

LIGHT BARRIER HAVING MULTIPLEXER FOR ACTUATING TRANSCEIVER PAIRS AND MULTIPLE CHANNEL OPERATION

BACKGROUND OF THE INVENTION

U.S. Pat. No. 4,520,262 discloses a light barrier system utilizing a plurality of individual transmitters of light, a like plurality of individual receivers of light, and a like plurality of light conducting paths. Each transmitter is connected to its corresponding receiver by a corresponding path so that the light emitted by any transmitter can only impinge upon the corresponding receiver. The light emitted is in the form of pulses. The transmitters are selectively actuated and deactuated in selected format by a multiplexer. The corresponding receivers are synchronized to respond in the same format by a demultiplexer. When the system functions properly each receiver will receive and respond only to the light pulse emitted by the corresponding transmitter. A large circuit is used to check the response of each receiver when its transmitter emits a light pulse and also checks this response when its transmitter does not emit a light pulse. Consequently faulty operation of the receiver either by not receiving a light pulse when its transmitter produces a pulse or by receiving a spurious pulse when its transmitter does not produce a pulse can be detected and appropriate corrective action can be taken.

However, this known system suffers from the disadvantage that the logic circuit does not always respond reliably to all types of faults and particularly to faults created by failures of individual components. This circuit is also subject to false alarms triggered when the phase position and the pulse widths of the individual pulses do not coincide with the high degree of accuracy required.

SUMMARY OF THE INVENTION

It is an object of the present invention to provide a new type of evaluation circuit for use with the aforementioned light barrier system which provides enhanced security and reliability.

Another object of the invention is to provide a new type of evaluation circuit which employs first second and third channels wherein measurements and testing can be performed continuously using the first and second channels, with the third channel number monitoring the operation whereby component failures can be detected immediately.

In accordance with the principles of the invention, an evaluation circuit is to be used with a light barrier system of the aforementioned type. The circuit employs first means for initiating a measuring operation in which each transmitter-receiver pair is individually actuated in a selected sequence. A first channel produces a first signal when each receiver has properly received a light pulse emitted by its corresponding transmitter, the first signal suddenly changing value whenever a receiver fails to receive a light pulse emitted by its corresponding transmitter. Second means initiates a testing operation in which each transmitter-receiver pair is individually actuated in the same sequence but in such manner that the each receiver will not receive any light pulse emitted by its corresponding transmitter.

A second channel produces a second signal when each receiver has not received any light pulse, the second signal suddenly changing value whenever a receiver receives a light pulse.

A third channel monitors the response of said first and second channels, the third channel increasing the response sensitivity of the second channel when the second signal changes value.

The reliability can also be increased because individual components of the plant or machine, i.e. external components of the light barrier system which are monitored by the latter are incorporated into the evaluation circuit or monitoring circuit.

While the evaluation circuit reduces any risk of a false alarm, its reliability is also increased by employing analog signal processing in all three channels, whereas the input and output signals of said three channels are pulse-shaped and therefore digital signals.

Reliability is also increased in the evaluation circuit because faultless operation of one channel causes inverse output signals to be produced in another channel, so that in trouble free operation a switching element controlled by one channel is always active, as for example an energized relay, while a switching element in another channel is correspondingly passive, as for example a deenergized relay.

The evaluation circuit can also be so designed as to disable the monitored machine or plant when an error is found and operation can only begin again after an operator actuates a resetting key. This can only take place when the fault has been completely eliminated.

The aforementioned objects and advantages of the invention as well as other objects and advantages thereof will either be explained or will become apparent to those skilled in the art when this specification is read in conjunction with the accompanying drawings and specific description of preferred embodiments which follow.

DETAILED DESCRIPTION OF THE PREFERRED EMBODIMENTS

Figure 1:
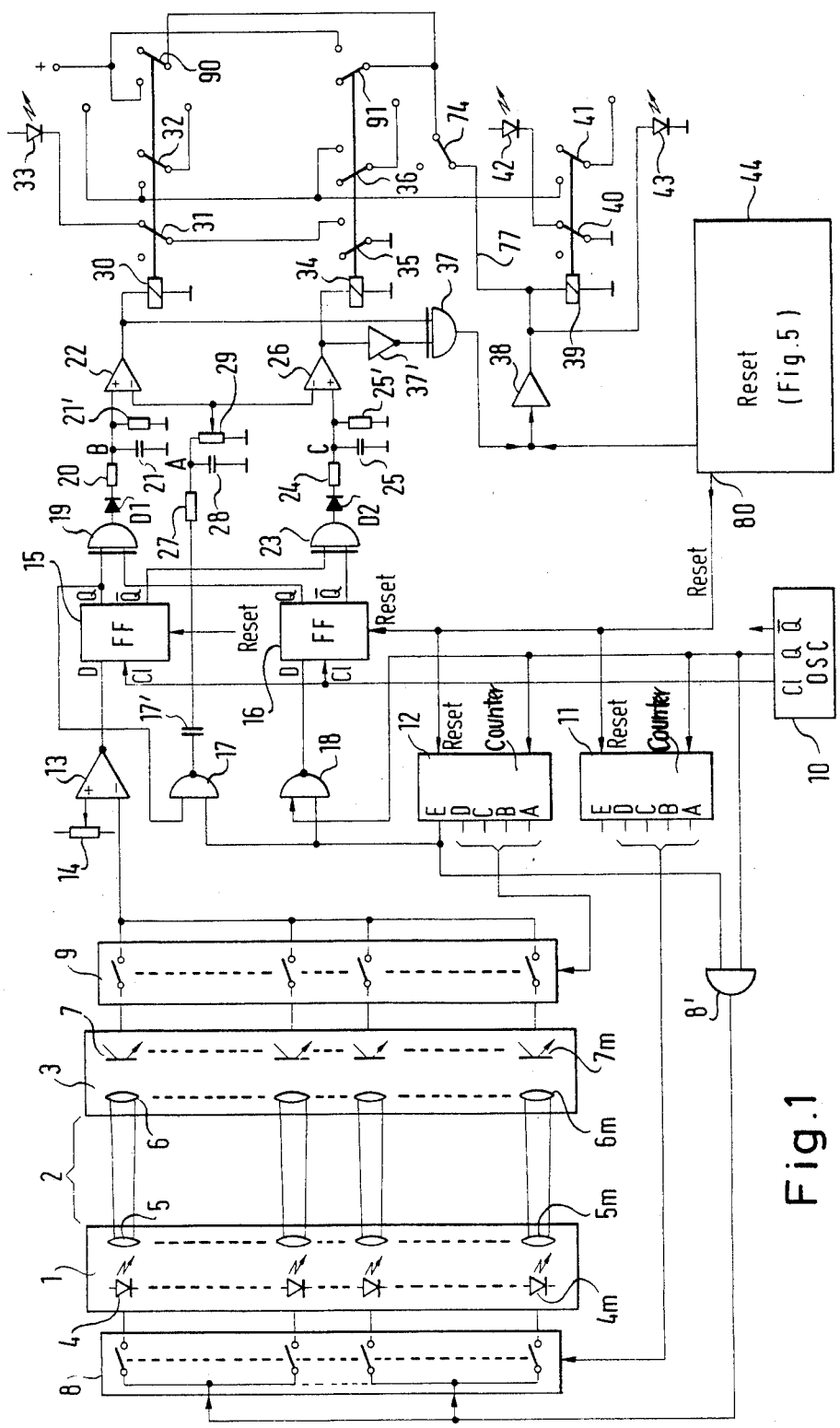
FIG. 1 is a block circuit diagram of a light barrier system which incorporates an evaluation circuit in accordance with one embodiment of the invention.

FIG. 1 shows a block circuit diagram of the circuit according to the invention. A transmitter 1 transmits light beams, e.g. in the infrared range, over a path or distance 2 to be monitored to a receiver 3. Transmitter 1 here contains a plurality of light-emitting diodes 4 to 4m, which are normally arranged in the form of a linear diode row. With each light emitting diode or LED 4 is associated a corresponding optical means in the form of lenses 6 to 6m, which conduct the received light beams to a like plurality of photosensitive elements 7 to 7m. A specific photosensitive elements 7 to 7m is associated with each of the light emitting diodes 4 to 4m. Optical means 5, 6 ensure that the light beams of a particular LED are essentially only conducted onto the photosensitive element associated therewith.

The individual light emitting diodes 4 are sequentially and successively activated, by a transmitter-side multiplexer 8. In the same way, the receiver-side photosensitive elements 7 are sequentially and successively polled by means of a receiver-side multiplexer 9. Both multiplexers 8, 9 are synchronized with one another, so that (in one measuring phase) only that photosensitive element 7 is polled whose associated LED 4 transmits.

An oscillator 10 produces square waves pulses with a fixed given frequency, clock pulses being supplied at its output C1 and control pulses at its output Q. The frequency of the control pulses is lower than that of the clock pulses in a ratio of 1:2. The pulses of output Q of oscillator 10 are supplied to two counters 11, 12, which in this case are binary counters. These counters also run synchronously to one another and are used for controlling multiplexers 8, 9. As a function of the reading of counter 11, 12 multiplexers 8, 9 are indifferent, but clearly defined switching states. The output pulses at output Q of oscillator 10 are supplied to the signal input of multiplexer 8. In the feedline is connected an AND-gate 8', whose other input is connected to the highest bit position E of counter 12. Only if this bit position carries a 1 is the transmitter activated. This bit position is reversed between a measuring phase and a test phase. During the test phase the transmitters are inactive and only the receivers are polled. As a function of the counter reading of counter 11, a pulse is supplied from multiplexer 8 to one of the light emitting diodes 4, which emits light for the duration of this pulse. This pulse is received by the associated photosensitive element 7 and by means of multiplexer 9 and its control by counter 12 precisely the associated photosensitive element 7 is polled, so that its output signal appears at the output of multiplexer 9. (In this operating mode multiplexer 9 more precisely operates as a demultiplexer.)

The two counters 11, 12 could be replaced by a single binary counter, which then in parallel would control the two multiplexers 8, 9. However, preference is given to two separate counters to ensure fail-safe operation of the individual components.

The output signal of multiplexer 9 is supplied to an evaluation circuit, which in principle operates with three channels. One channel fundamentally monitors the intervals between two light pulses and the third channel monitors the two other channels. The evaluation circuit is constructed as follows. The output signal of multiplexer 9 is supplied to the inverted or inverting input of comparator 13, to whose inverting input is supplied a comparison or reference value by a comparison or reference value supplying means 14. The comparator 13 acts as an inverting comparator, its output signal being supplied to the D-input of a D-flip-flop 15. Clock input C1 of said flip-flop 15 is connected to the output C1 of oscillator 10. Output Q of flip-flop 15 is connected to one input of an EXCLUSIVE-OR GATE 19. (The D-flip-flop functions in such a way that it so changes its switching state when a clock pulse reaches input C1 that its output Q is brought to the logic level of its D input.)

A second D-flip-flop 16 is connected by its clock input C1 to output C1 of oscillator 10. Its D input is connected to the output of NAND gate 18, whose one input is connected to output Q of oscillator 10 and whose other input is connected to counter 12, namely to output E, which carries the highest bit position of counter 12. Counters 11 and 12 have n-outputs and can therefore count up to $2^n$. The number m of light emitting diodes 4 and photosensitive element 7 is therefore $m=2^{n-1}$. Thus, in a complete counting cycle of counters 11, 12, multiplexers 8, 9 consequently switch through all the possible switching states thereof twice.

Output Q of the second flip-flop 16 is connected to the other input of the EXCLUSIVE-OR gate 19. In the same way the two inverting outputs Q of flip-flops 15, 16 are connected to the two inputs of a further EXCLUSIVE-OR gate 23. The outputs of both EXCLUSIVE-OR gates 19, 23 are connected across diodes D1, D2 connected in the forward direction to integrated RC-elements 20, 21 or 24, 25, the output thereof (points BorC) being in each case connected to the non-inverting input of a comparator 22 or 26. Comparator 26 of the second channel is also an inverting comparator. Parallel to capacitors 21, 25 are resistors 21', 25', which determine the discharge time constant of capacitors 21, 25. Diodes D1, D2 prevent capacitors 21, 25 from discharging across the outputs of EXCLUSIVE-OR gates 19,23. The first channel is constituted by components 15, 19, D1, 20, 21' and 22, while the second channel is constituted by components 16, 23, D2, 24, 25', and 26.

The third channel contains a NAND gate 17, whereof one output is connected to the output Q of flip-flop 15 and the other input is connected to output E of counter 12. The output NAND gate 17 leads across a coupling capacitor 17', which only permits the passage of dynamic parts of the output signal of NAND gate 17, to a third integrating RC-element 27, 28, whose output A is connected across a voltage divider (resistor 29) to the two inverting inputs of comparators 22, 26. Comparators 22, 26 control in each case one relay 30, 34, both relays in this case operating three switching contacts 31, 32, 90 or 35, 36, 91. The two switching contacts 31, 35 are connected in series, said series connection being connected to ground on one side and on the other side to an LED 33, whose other connection is connected to a not shown voltage supply. Switching contacts 32, 36, 90, 91 are contacts for the control of a plant, machine, etc. monitored by the light barrier. All the switching contacts are shown in the inoperative state in FIG. 1, i.e. with the relay not energized.

In addition, the two outputs of comparators 22, 26 are connected to in each case one input of an EXCLUSIVE-OR gate 37, whose output controls across an amplifier 38 a further relay 39, which has two switching contacts 40, 41. The output of comparator 26 is supplied to an inverting input of the EXCLUSIVE-OR gate, which is indicated by an inverter 37'. Conversely, if present, the non-inverting output of comparator 26 can be connected to a non-inverting input of EXCLUSIVE-OR gate 37.

There is a further LED 42 in series with switching contact 40. Switching contact 41 also serves as the output of the circuit and is also used for the mentioned resetting function. A further LED 43 is connected to the output of amplifier 38. Finally the output of EXCLUSIVE-OR gate 37 is connected to a resetting circuit 44, which will be explained in greater detail relative to FIG. 5. This resetting circuit (reset) is connected by its output connection 80 to the resetting inputs of counters 11, 12, as well as flip-flops 15, 16.

Figure 5:
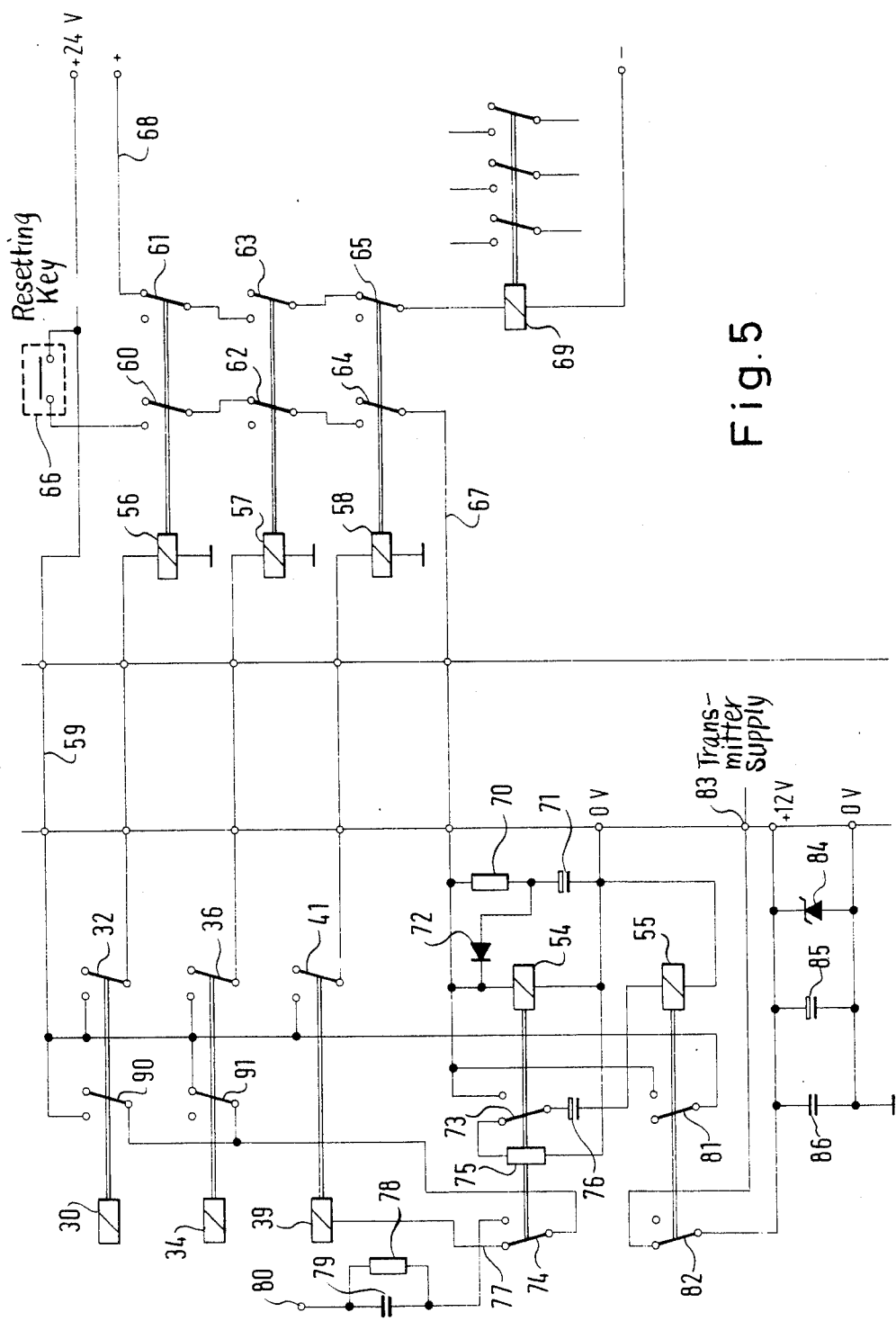
FIG. 5 is a block circuit diagram of the resetting circuit shown in FIG. 1.

As soon as a resetting instruction logic level 0) appears there, the two flip-flops 15, 16 and the two counters 11, 12 are reset to a clearly defined state, so that the two counters and the two flip-flops are synchronized. Switching contacts 90, 91 apply an operating voltage to a line 77, when relay 30 is energized and/or relay 34 is not energized. Line 77 is connected to relay 39. It can be energized either by amplifier 38 or switching contacts 90, 91. A further switching contact 74 is interposed in line 77 and in the case of trouble free operation is in the closed position shown in FIG. 1. It is operated by a relay 54 (FIG. 5 of the resetting circuit).

Figure 2:
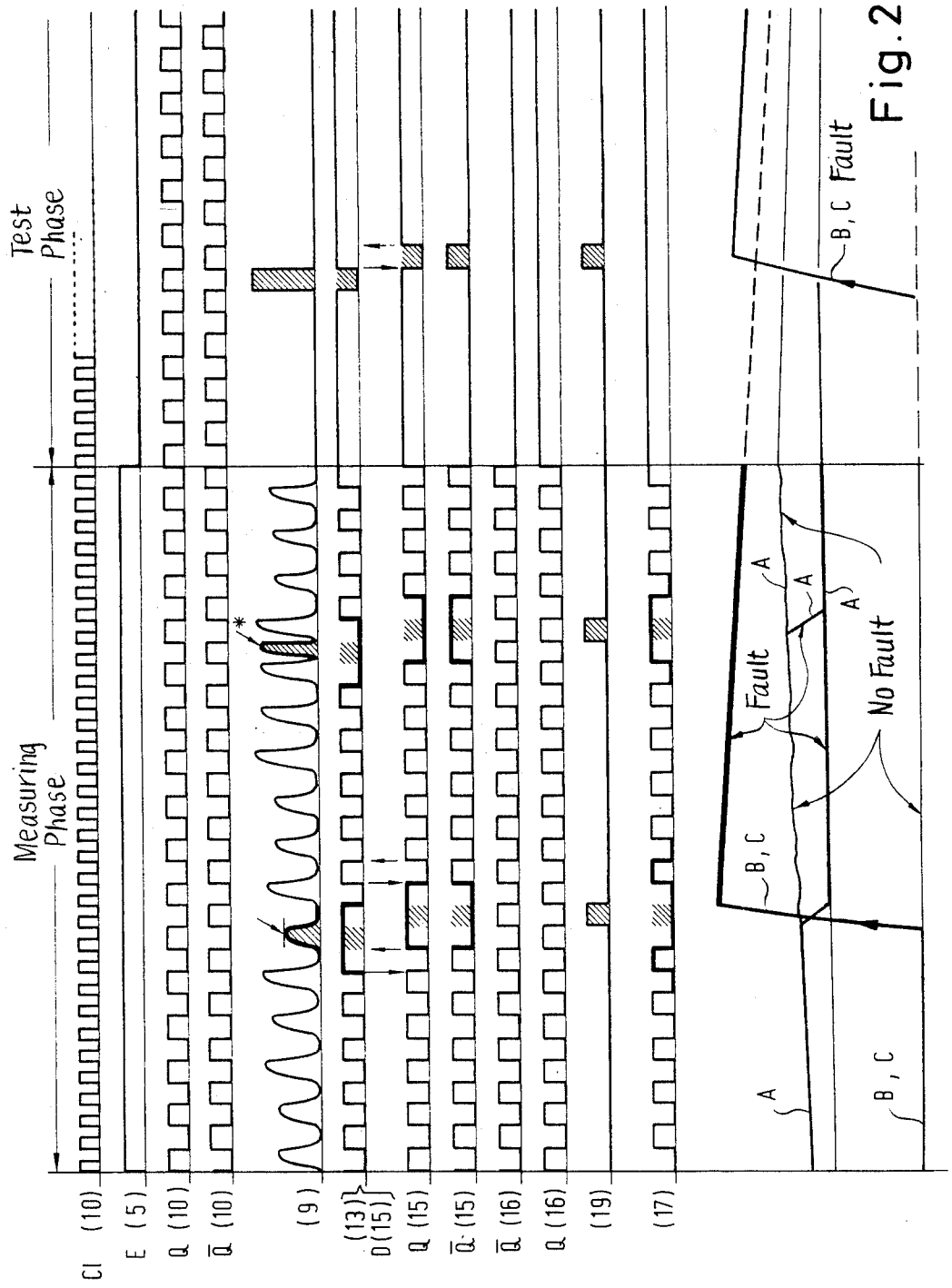
FIG. 2 is a pulse diagram of selected pulses employed in the system of FIG. 1.

An explanation of the circuit of FIG. 1 is set forth below with reference to the pulse diagram of FIG. 2. FIG. 2 shows the time behaviour of selected signals, the reference numerals given in FIG. 2 relating to the components of FIG. 1. Thus, e.g. "Q (15)" is the pulse train at output Q of flip-flop 15.

Oscillator 10 continuously produces the clock pulses C1 (10). In a "measuring phase" output E of counter 12 is at logic 1, so that in the represented embodiment said measuring phase lasts 16 pulses of output Q of oscillator 10.

It is now assumed that counters 11 and 12 have the reading "1 ... 000" (E is at 1 and all the other counter outputs at 0). The first pulse Q (10) brings the two counters 11, 12 into counting state "100 .. 01", so that the two multiplexers 8, 9 now activate the first pair of associated light emitting diodes and photosensitive elements. Furthermore, the first pulse Q (10) across the correspondingly connected-through multiplexer 8 supplies energy to the first LED 4 and in the case of an uninterrupted path 2, the light beam strikes the first photosensitive element 7, which supplies a voltage pulse, which passes across multiplexer 9 to comparator 13. The corresponding signal sequence is designated "Ausg. (9)" in FIG. 2. Comparator 13 compares this pulse train with a preset threshold (from means 14). If the amplitude of the signals at the output of multiplexer 9 is higher than said threshold, then comparator 13 switches through. However, this does not take place if it is smaller than the threshold. Due to the additional inverting action of comparator 13, the signals Ausg.(13) of FIG. 2 appear at its output, so that comparator 13 acts as an inverting pulse shaper. As soon as a logic 1 appears at input D of flip-flop 15, it is reversed at the next following clock pulse C1, so that signal sequences Q (15) and $\overline{Q}$ (15) are obtained. These signals are displaced by phase of 180 degrees of signal Q (10) with respect to the signals at the output of comparator 13, which is brought about by the characteristics of the D flip-flop. Thus, signal Q (15) constitutes a phase-displaced, inverted, square wave pulse-shaped signal of the actual state at the output of multiplexer 9. Each pulse represents one of the $2^{n-1}$ pairs of light emitting diodes and photosensitive elements, because for each further pulse Q(10) the counters 11, 12 switch on and correspondingly multiplexers 8, 9 activate the next pair 4 and 7.

During the measuring phase flip-flop 16 receives at its D input the pulses $\overline{Q}$ (10), which in phase displaced manner represent the desired value for the light pulses (E from 12 is on 1). The action of flip-flop 16 also brings about a corresponding delay or phase displacement. The signals of the Q outputs of flip-flop 15 (actual value) and flip-flop 16 (desired value) are "compared" with one another in the EXCLUSIVE-OR gate 19. If the two signals are identical (both 0 or both 1), then the output of gate 19 carries a 0. However, if they differ, the output of gate 19 carries a 1, which indicates that a fault is present. Such a fault during the measuring phase is illustrated in FIG. 2 by means of the pulses represented in hatched manner.

It is assumed that the light path 2 is interrupted at one point, so that the signal level at the output of multiplexer 9 does not reach the threshold. Correspondingly, the output of the inverting comparator 13 remains at 1 and does not pass to 0, as should be the case with satisfactory operation. In phase-displaced manner output Q (15) remains at 1 and the inverted output $\overline{Q}$ (15) remains at 0. Thus, at EXCLUSIVE-OR gate 19 there is a 1 (from Q (15)) and a 0 (from Q (16)), so that the gate supplies the "fault pulse" represented in hatched form in FIG. 2. Correspondingly the inverted outputs $\overline{Q}$ of flip-flops 15, 16 then differ ($\overline{Q}$ (15) is at 0 and $\overline{Q}$ (16) at 1), so that the EXCLUSIVE-OR gate 23 also supplies a corresponding pulse. These pulses are now integrated up in RC-elements 20, 21, 24, 25, so that at points B and C appears the signal (B and C) represented at the bottom of FIG. 2. In other words said signal is at lower level for as long as no fault occurs and then suddenly passes to a high level as soon as a fault occurs. It then drops slowly, essentially through the discharge of capacitor 21 or 25 across discharge resistors 21', 25'. Diodes D1, D2 prevent any possibility of the capacitors discharging in undefined manner across the outputs of EXCLUSIVE-OR gates 19 and 23.

The comparison signal located jointly at comparators 22, 26 (curve A in FIG. 2) during the measuring phase represents the integration up and down of the dynamic part (capacitor 17') of the inverted output signal $\overline{Q}$ flip-flop 15 (NAND gate 17 inverts signal Q). The discharge time constant of capacitor 28 is determined by resistor 29, which is roughly equal to the time constant for charging capacitor 28. Thus, in the case of a continuous square-wave signal (output of 17) a substantially constant signal is obtained at point A, which serves as a comparison signal for the two comparators 22, 26. As soon as a fault occurs, the output signal of the NAND gate 17 has a "pulse gap", so that signal A drops by a given level, so that the two comparators 22, 26 are switched even more sensitively. In the case of several successive "pulse gaps", the signal A drops correspondingly further, so that the sensitivity of the two other channels is correspondingly increased.

As soon as there is no fault the output of comparator 22 is at 0, so that relay 30 is not energized. Conversely the inverted output of comparator 26 is at 1·in the case of faultless operation, so that relay 34 is energized. Thus, the circuit to the (yellow) diode 33 is closed across the two switches 31, 35 and diode 33 lights up. As a result of inverter 37', the two inputs of EXCLUSIVE-OR gate 37 receives identical signals, so that its output is at 0. Thus, relay 39 is not energized and switch 40 is in the closed inoperative position, so that the (green) LED 42 lights up, but the (red) LED 43 does not.

In the case of a "normal" fault (interruption of the light path 2 or light from other light sources striking the receiver), both comparators 22, 26 are reversed. Relay 30 pulls up and relay 34 drops out. Then, by means of the resetting circuit described in connection with FIG. 5, either an alarm is given or the machine being monitored is switched off. By reversing relays 30, 34, switches 90, 91 are also reversed, so that across line 77 (switch 74 closed) relay 39 is energized, so that switches 40, 41 are reversed. LED 42 goes out and the (red) LED 43 lights up.

In the case of certain faults, such as a failure of the first and/or second channel 19 to 22 and/or 23 to 26, EXCLUSIVE-OR gate 37 receives signals with the same level at both inputs. It then switches through, so that relay 39 is energized across amplifier 38. The (green) LED 42 goes out and the (red) LED 43 lights up. Switches 40, 41 are reversed. Thus, relay 39 can be energized in two different ways (90/91 or 37/38).

In the case of the above-described "normal" fault case, it has been assumed that a light pulse is missing or does not appear with an adequate intensity at the receiver. At the points indicated with an asterisk in FIG. 2 an explanation is provided of the case where a light pulse occurs at a point where it should not in fact occur. At the output of multiplexer 9 then appears an additional pulse shown in hatched form. Thus, the pulse is missing at the output of comparator 13 and is phase-displaced at the output Q of flip-flop 15. By means of the EXCLUSIVE-OR link of Q (15) (then logic level 0) with Q (16) (logic level 1), once again a fault pulse appears at the output of EXCLUSIVE-OR gate 19. Correspondingly curves B and C rise and curve A falls, as represented at the first fault. The last-discussed fault case is not shown in connection with curves A, B and C of FIG. 2.

As soon as output E of counter 12 carries a logic 0, the system is in a test phase. Either by means of output E of counter 11 (the AND gate is then omitted) or AND gate 8, multiplexer 8 or transmitter 1 is put out of operation in such a way that the input of the multiplexer is connected to none of the outputs or no energizing or exciting pulse (Q from 10) reaches the light emitting diodes, so that none of the latter receives an activating signal.

However, multiplexer 19 passes through a cycle. It is therefore polled as to whether one of the photosensitive elements 7 to 7m receives an (erroneous) signal. For as long as this is not the case, a low level signal is at the output of multiplexer 9 and is clearly below the threshold of the reference value supplying means 14, so that the inverting comparator 13 constantly carries a logic level 1 in the fault free case. Thus, at the D input of flip-flop 15 there is constantly a logic 1, so that at its output Q it constantly carries the level 1, but is not reversed in the case of subsequently occurring clock signal C1. Correspondingly output $\bar{Q}$ of flip-flop 15 constantly carries a logic 0.

Through the logic 0 at output E of counter 12 NAND gate 18 constantly carries a logic 1 at its output, independently of what takes place at its other input. Correspondingly flip-flop 16 constantly switches its output Q to a logic 1 and its inverted output $\bar{Q}$ to a logic 0. Thus, when no fault occurs, both EXCLUSIVE-OR gates 19, 23 have identical signals at their inputs, so that their outputs carry a logic 0. Thus, points B and C are consequently at low level. Due to the logic 0 from output E of counter 12, the output of NAND gate 17 constantly carries a logic 1. However, capacitor 17' blocks this d.c. voltage value, so that capacitor 28 discharges across resistor 29 and the signal at point A slowly passes towards 0. If at output of multiplexer 9 during the testing phase a faulty signal occurs, either due to infrared light irradiated by an external light source and which has the same wavelength range or through faulty components in the circuit, then the signal represented in hatched form during the test phase in FIG. 2 appears at the output of the multiplexer 9, but naturally in the latter case this only takes place with certain faults. Correspondingly the output of comparator 13 then has a breakdown of its signal level to a logic 0, which then in phase-displaced manner at flip-flop 15 also leads to a breakdown (output Q) or to a positive pulse ($\bar{Q}$). However, flip-flop 16 is not affected by such a fault, so that EXCLUSIVE-OR gates 19 and 23 have different signals at their inputs when the fault occurs, so that their outputs carry a short-term pulse with a logic 1. As described hereinfore, the signals at points B and C then suddenly pass upwards, so that comparators 22, 26 again respond.

Figure 3:
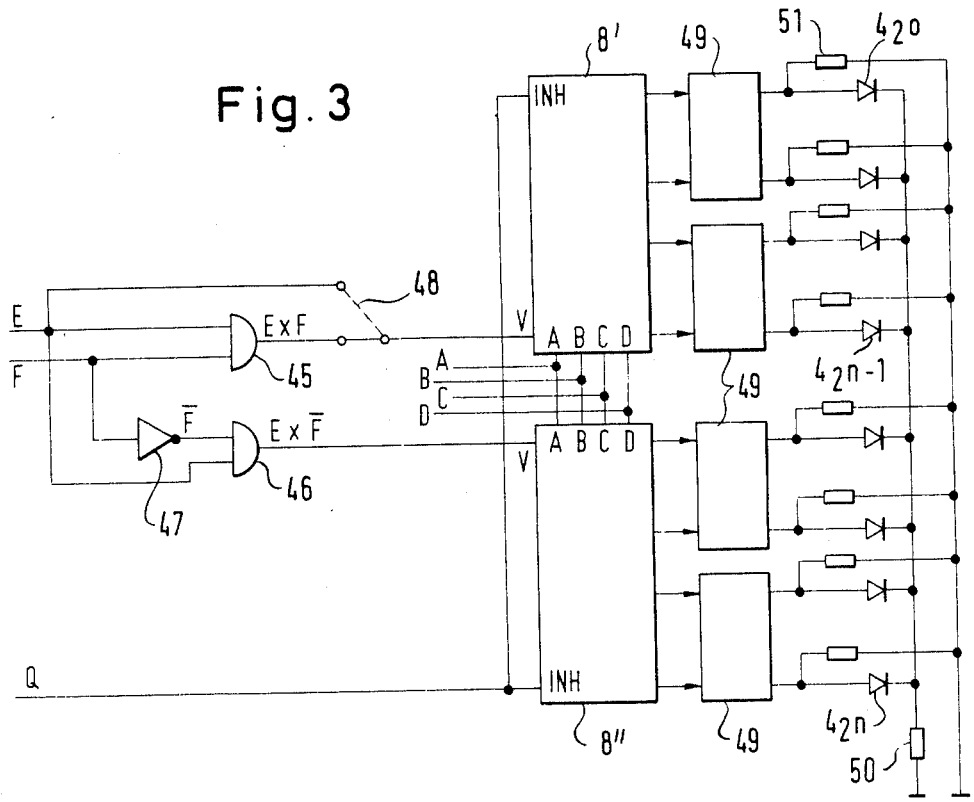
FIG. 3 is a block circuit diagram of a modified form of a transmitter-side multiplexer together with its control means.
Figure 4:
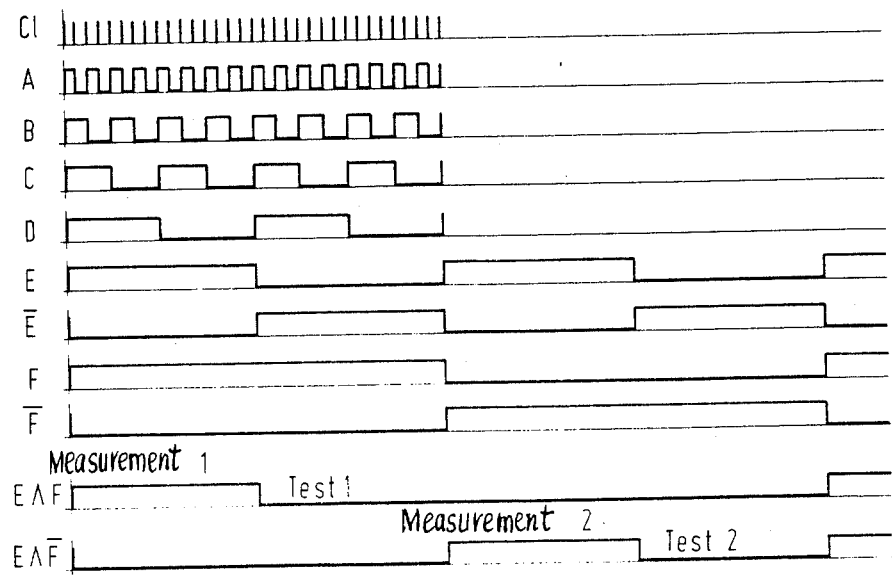
FIG. 4 is a pulse diagram for illustrating operation of the diagram of FIG. 3.

FIG. 3 shows in greater detail the control of the transmitter-side multiplexer for the case with 32 ($2^5$) transmission - reception channels. In the embodiment of FIG. 3 conventional type 4067 multiplexers are used, which can in each case control only $2^4 = 16$ channels. Thus, two multiplexers 8' and 8" are provided, which receive at their control inputs A, B, C and D the output signals of counter 11 (FIG. 1), which are shown in FIG. 4. In the represented embodiment, these are counting pulses in BCD code with six bit positions A to F. The 4-bit multiplexers 8' and 8" now in each case a preset input V, which has the effect that the multiplexer only fulfils its function in the case of a logic 1 at said input, while in the case of a logic 0 at said input it switches signal Q from oscillator 10 to none of the outputs. The measuring - testing cycle takes place in such a way that for each of the individual multiplexers 8', 8" there is a complete cycle with measuring phase and test phase, before the other multiplexer forms the corresponding phases. For this purpose, use is made of outputs E and F of counter 11, which are interlinked by means of an AND gate 45 and supplied to the preset input V of the first multiplexer 8'. However, the second multiplexer 8" is supplied via the AND gate 46 with a combination or link of signal E and the signal inverted by inverter 47, i.e. the link E and $\bar{F}$, said signals also being shown in FIG. 4. For as long as E AND $\bar{F}$ carry a logic 1, multiplexer 8' carries out its cyclic switching, so that the individual light emitting diodes $4_0$ to $4_{2n}-1$ are successively activated. During this time the signal E AND $\bar{F}$ is at logic 0, so that the second multiplexer 8' is put out of operation. Corespondingly the multiplexer 8' performs the first test phase, whereupon the second multiplexer 8" performs its measuring phase (measurement 2) and then its test phase (test 2).

Thus, with a 6 bit counter 16, it is possible to operate a total of 32 light emitting diodes $4_20$ to $4_2n$. If only 16 diodes are used, signal E is directly connected to the preset input V of multiplexer 8', as indicated by the broken line 48. It can be a reversing switch, so that the system can be operated, as required, with 16 or 32 channels. Correspondingly the system can naturally be extended to even more channels.

In FIG. 3 driver transistors 49 are connected between the outputs of multiplexers 8', 8" and the diodes. Thus, the cathodes of the LED's are interconnected said connection point being connected to ground across a resistor 50. An ohmic resistor is in each case connected to the anodes of the diodes, the other connections of said resistors being in each case grounded.

FIG. 5 shows in greater detail the resetting circuit 44. Relays 30, 34, 39 with their switching contacts 90, 32, 91, 36 and 41 are also present in FIG. 5 and are also functionally parts of the resetting circuit, although shown separately therefrom in FIG. 1. The resetting circuit operates together with eight relays, namely relays 30, 34 and 39 and relays 54, 55, 56, 57, 58. Relays 56, 57 and 58 are energized by means of the switching contacts 32, 36, 41 of relays 30, 34, 39. Contacts 32, 36, 41 are not live when their relays are in the deenergized state, but when said relays are in the energized state supply via line 59 positive exciting voltage (here 24 V) to the associated relays 56, 57, 58. All the switching contacts in FIG. 5 are shown in the rest state. In each case relays 56 to 58 operate a pair of switches with switches 60, 61, or 62, 63 or 64, 65. Switches 60, 62, 64 are in series connection with a resetting key 66, said series connection being connected to the positive supply voltage (line 59). If relays 56 and 58 are in the rest state, then switches 60, 64 are separated from the resetting key 66. In the energized state, switches 60, 64 are connected to the resetting key. When relay 57 is in the rest state, switch 62 is connected to switch 60, but is separated therefrom when relay 57 is energized. The output of series connection 66, 60, 62, 64 is connected to a line 67.

The three switches 61, 63, 65 are also in series connection, switch 61 being connected in the rest state to a line 68. In the inoperative state, switch 63 is open, whereas in the same state switch 65 is closed and therefore connected to switch 63. There is a further relay 69 in series with said three switches 61, 63, 65 and said relay has in this case three switches, which are the active switches for controlling the machine functions. As desired line 68 can be grounded or at positive supply voltage. The other connection of relay 69 is conversely at supply voltage or grounded. If all three switches 61, 63, 65 are closed, i.e. relays 61, 65 are deenergized and relay 34 is energized, then relay 69 is energized and then the desired machine function (operation) are initiated. If one or more of the relays 56, 57 or 58 changes the described state, then relay 69 drops out, so the e.g. the monitored machine is put out of operation.

In the case of a fault, there is then a positive potential on line 67 if simultaneously relays 56, 58 are energized, relay 57 is not energized and the resetting key 66 is depressed.

If as a result of a fault of components the switch of the EXCLUSIVE-OR gate 37 responds, then only one of the relays 30 or 34 has changed its state and correspondingly only one of the relays 56 or 58. Thus, the series connection 60, 62, 64 is interrupted by an opened switch, so that in the case of such a fault no resetting is possible (key 66).

The resetting takes place by the components described hereinafter. Between line 67 and ground or 0 v, relay 54 is switched. Parallel to said relay is provided a series connection of a resistor 70 and a capacitor 71. The common connection point of these two components is connected across a diode 72 to the terminal of relay 54, which is applied to line 67. Relay 54 also operates two switches, i.e. 73, 74. In the represented rest state, switch 73 is connected to a resistor 75, whose other terminal is grounded or at 0 v. When relay 54 is in the energized state, switch 73 is connected to line 67. The third terminal of switch 73 is connected across a capacitor 76 to relay 55, whose other terminal is once again grounded or at 0 v.

The second switch 74 of relay 54 connects supply voltage to a line 77 (rest state) or to a parallel connection of a resistor 78 and a capacitor 79, which is in turn at a connection or terminal 80 (relay energized). Connection 80 then carries the reset signal, which resets flip-flops 15, 16, as well as counters 11, 12 (FIG. 1). For as long as relay 54 is not energized and switch 74 is consequently in the indicated position, relay 39 can be energized across switches 90 and/or 91. Further details will be given in connection with FIG. 7.

Relay 55 also has two switches 81, 82, the former being open in the inoperative state. In the closed state it connects line 67 to line 59 and therefore applies supply voltage to line 67, independently of switches 60, 62, 64, 66.

In the inoperative state switch 82 is closed and thereby links a supply voltage of in this case 12 v to a supply connection 83 for supplying the transmitter. The indicated +12 v supply voltage is protected by a Zener diode 84 against voltage peaks, as well as being smoothed by two capacitors 85, 86.

The operation of resetting circuit of FIG. 5 will now be explained. The circuit is in the following state for as long as no fault appears. Relays 30, 56; 39, 58 and 54, 55, 69 have dropped out and the associated switches are in the represented inoperative position. However, relays 34, 57 are energized, switch 36 is closed and switches 62, 91 are open. Thus, switch 92 interrupts the circuit from resetting key 66 to line 67 and consequently operation of the key has no effect. The circuit to relay 69 is closed by the closed switches 63, as well as 61 and 65, so that this relay is energized and the desired machine functions are activated by closing its associated switch. Switches 90, 91 are opened, so that relay 39 is not energized in this way.

If a fault now occurs, then at least one of the relays 30, 34, 39 and therefore also 56, 57, 58 changes its state. Reference will firstly be made to "normal" fault, e.g. an interruption of the light barrier. Relays 30, 34, 39, 56, 57 and 58 are reversed, i.e. relays 30, 39, 56, 58 are pulled up, while relays 34, 57 drop out. Thus, the supply circuit for relay 69 is interrupted across switches 61, 63, 65, so that said relay drops out, so that the machine is put out of operation. Simultaneously through switches 60, 62, 64 switching takes place of the current path for operating the resetting key 66. If the latter is depressed, then for as long as this depressing action persists a positive supply voltage passes to line 67 and therefore to relay 54, which pulls up. Capacitor 71 is also charged and ensures a self-holding function of relay 54 for a given time. As a result of the pulling up of relay 54, switch 73 is reversed and via capacitor 76 supplies a short pulse to relay 55, which is therefore briefly pulled up. Switch 82 opens and briefly disconnects the supply voltage for supplying the transmitter, so that the latter can no longer emit light pulses. During this short time interval, switch 81 supplies the positive supply voltage again to relay 54, so that independently of the time during which resetting key 66 is depressed, capacitor 71 is charged for a clearly defined time period, so that also the self-holding time of relay 54 is precisely defined. As a result of the pulling up of relay 54 switch 74 is reversed and terminal 80 is applied to earth or ground potential. Thus, counters 11, 12 and flip-flops 15, 16 are reset. If the previously detected fault, e.g. an interruption of the "light barrier" is eliminated, then with the described resetting the resetting circuit according to FIG. 5 is switched back into the previously described state, i.e. relays 30, 39, 56, 58 drop out, while relays 34, 57 pull up. However, if there is still a fault, e.g. the "light barrier" is still interrupted, then following a resetting relays 30, 34, 39 and 56, 57, 58 do not switch back, so that a putting into operation of the monitored machine at short notice during the resetting process is not possible.

A further "fault" occurs if the two counters 11, 12 do not run synchronously, because then the exciting of the light emitting diodes 4 does not coincide with the polling of the photosensitive element 7. This fault case will be dealt with by the circuitry in the same way as the aforementioned fault of the interruption of the light barrier.

As has been previously stated, the EXCLUSIVE-OR gate 37 responds when the two channels (outputs of comparators 22, 26) carry identical signals, i.e. taking account of inverter 37' there are non-identical signals at the inputs of the gate. Such a fault occurs if one of the two channels has dropped out, e.g. due to a failure of a component. Relay 39 is then energized by means of EXCLUSIVE-OR gate 37 and amplifier 38, optionally additionally to the energizing via switches 90, 91, 74. In this fault case the two relays 30, 34 are not reversed, so that the two relays 56, 57 do not reverse and the circuit from pushbutton switch 66 to line 67 remains interrupted. Resetting by operating switch 66 is then no longer possible. Therefore the faulty components cannot simulate a completely satisfactory operation. Resetting is only possible if all three relays 30, 34, 39 and therefore also relays 56, 57, 58 change their state.

Figure 7:
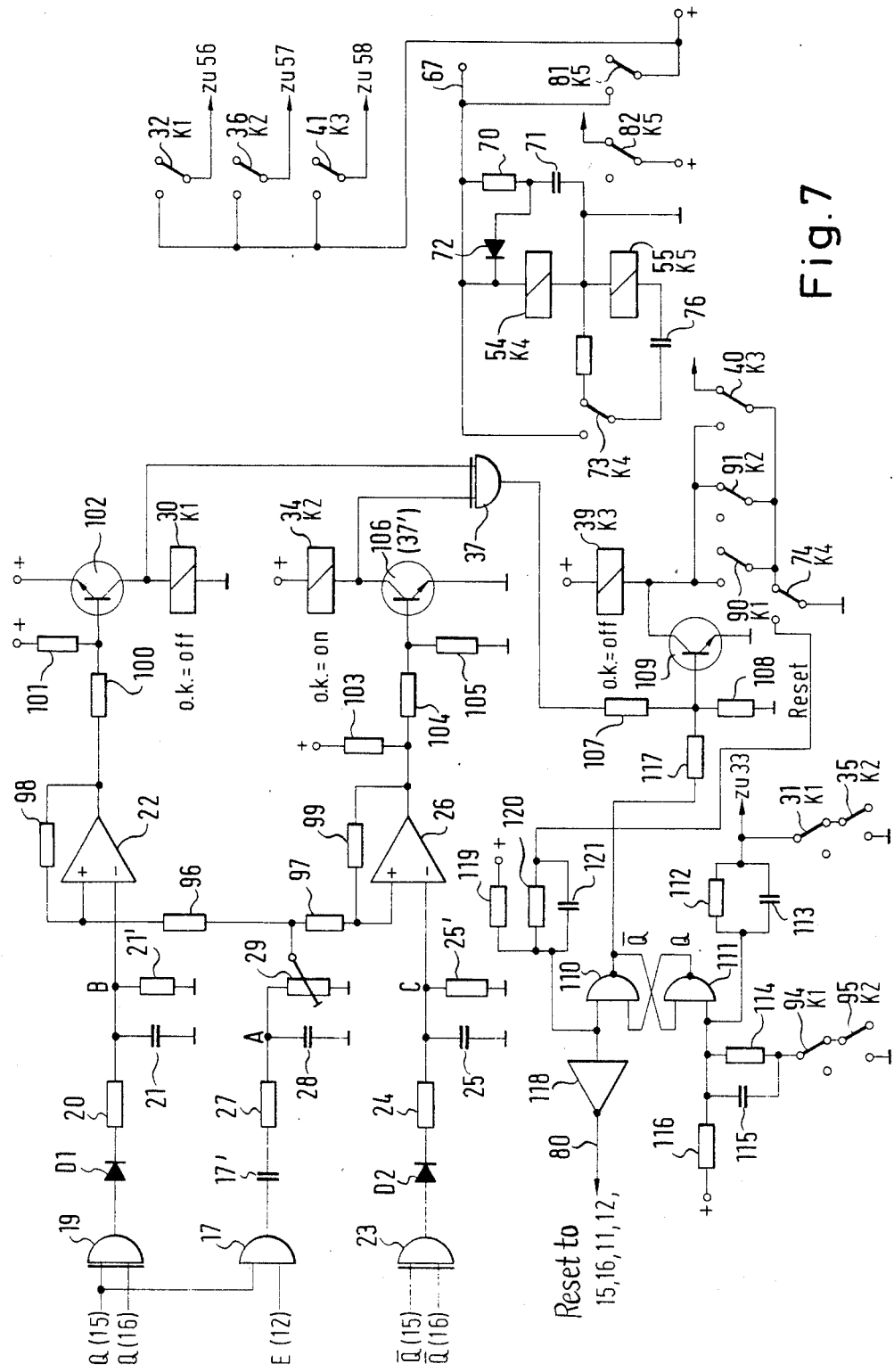
FIG. 7 is a detailed circuit diagram of parts of the evaluation circuit and resetting circuit in accordance with another embodiment of the invention.

FIG. 7 shows a circuit diagram of a somewhat modified embodiment of the invention. Components 1 to 16 and 18 of FIG. 1, which are also required in the embodiment of FIG. 7 have been omitted for the simplification of the representation. If the complete circuit is required, then the connections or terminals of gates 17, 19 and 23 can be connected to the terminals or connections of components 15, 16 and 12 of FIG. 1. Up to comparators 22, 26 the evaluation circuit of FIG. 7 (components with reference numerals 17 to 26) corresponds to the embodiment of FIG. 1, so that reference is made to the corresponding description. Unlike in FIG. 1, in FIG. 7 the tap of voltage divider 29 is connected across in each case one resistor 96, 97 to the non-inverting input of comparators 22, 26. Moreover, both comparators 22, 26 have in each case one feedback resistor 98, 99 from the output thereof to the non-inverting input. The output of comparator 22 is connected across a resistor 100 to the base of a transistor 102, said base being supplied with a bias voltage across a resistor 101. As the polarity of the inputs of comparator 22 has been interchanged compared with the embodiment of FIG. 1, its output signal is inverted with respect to the embodiment of FIG. 1. In the case of a fault (signal D>signal A), its output consequently carries a low level signal (e.g. ground potential). In this case the base potential of transistor 102 is reduced across voltage divider 101, 100, which causes switching thereof and the energizing of relay 30. Thus, transistor 102 acts as an inverting amplifier. As a result of the double inversion compared with the embodiment of FIG. 1, the same switching states as in FIG. 1 are obtained for relay 30. To more clearly stress the association of the relays with their switching contacts, the designations K1 to K5 are given to the relays and their associated contacts.

Compared with the embodiment of FIG. 1, in the case of the second channel on comparator 26 the input terminals or connections are again interchanged, so that it is designed as a non-inverting amplifier in FIG. 7. The output of comparator 26 is connected to a voltage divider comprising resistors 103 on the one hand and 104 and 105 on the other. The other terminal of resistor 103 is at supply voltage. The common connection point of resistors 104, 105 is connected to the base of a transistor 106, while the other terminal of resistor 104 is grounded. In the case of trouble free operation (signal C<signal A) comparator 26 is switched through and as a result of the dimensioning of resistors 103, 104, 105 also transistor 106, so that relay 34 is energized. However, in the case of a fault, the output potential of comparator 26 is at a low level, so that transistor 106 is also blocked and relay 34 is not energized. With regards to the signal supplied to the EXCLUSIVE-OR gate 37, transistor 106 acts as an inverting amplifier (corresponding to inverter 37' of FIG. 1), because when transistor 106 is switched through or gated gate 37 is supplied with a low level signal and vice versa.

The wiring of relay contacts 32, 36, 41, as well as relays 54, 55 and the components associated therewith (70 to 81) corresponds to the embodiment of FIG. 1 and does not therefore have to be described again. However, there are differences compared with FIG. 1 relative to the control of relay 39, as well as the components described hereinafter.

In the embodiment of FIG. 7, the parallel switches 90, 91 are in series connection with switch 74, said series connection being located between one terminal of relay 39 and ground. FIG. 7 also shows all the switches in the deenergized state of their relays. In trouble free operation, the two switches 90, 91 are consequently open and switch 74 is in the represented inoperative position. If in the case of a fault both or one of the relays 30 and/or 34 are reversed, then the associated switches 90, 91 are reversed, so that relay 39 is energized via the switching of its ground or earth connection.

As described in connection with FIG. 5, during the resetting process relay 54 (K4) is energized for a given time, whereupon switch 74 is also reversed. A flip-flop circuit of two crosswise-interconnected NAND gates 110, 111 is provided to ensure that this reversing or switching over does not cause the relay 39 to drop out again. As long as switch 74 is in the inoperative position, across a resistor 119 a control input of NAND gate 110 is at supply voltage potential. As soon as switch 74 has reversed through the energizing of relay 54, across a resistor 120 and a capacitor 121 connected in parallel thereto, the control input of NAND gate 110 is drawn to a lower potential, because resistors 119, 120 as voltage dividers are between the supply voltage and ground. The output of NAND gate 110 then carries a high level signal. This potential is supplied across a resistor 117 to the base of a transistor 109, which switches through or gates the ground line of relay 39. Thus, in the case of a fault with switch 74 open, the relay remains energized. Thus, flip-flop 110, 111 ensures a self-holding function of relay 39. The ground potential switched through to the control input of NAND gate 110 on energizing relay 54 still reaches the input of an inverter 118, whose output is line 80, which carries the resetting signal to flip-flops 15, 16 and counters 11, 12.

If during the resetting process relay 54 drops out again after the self-holding time determined by capacitor 71 and therefore switch 74 flips back into its inoperative position, flip-flops 110, 111 still remain in the previous switching state, which maintains relay 39 energized. As soon as trouble free operation exists again following resetting, flip-flop 110, 111 must switch over, so that relay 39 can drop out (setting function).

For this purpose the control input of the other NAND gate 111 is controlled by means of a voltage divider comprising a resistor 116 and a parallel connection of a resistor 114 or a capacitor 115, as well as a series connection of switching contacts 94, 95. Switching contact 94 is operated by a relay 30 and contact 95 by relay 34. The two contacts 94, 95 are in series connection with resistor 114 and connect its terminal to ground. The other terminal of resistor 116 is at positive supply voltage. Switch 94 is closed in the inoperative state, while switch 95 is open in the inoperative state. In the case of a fault, during which switches 94 and/or 95 are open, resistor 114 is separated from ground, so that the supply voltage is applied to the control input of NAND gate 111. If the output of NAND gate 110 is at high level, there is a high potential in this switching state at both inputs of gate 111, so that its output is at low potential. On switching over switches 94, 95 on removing the fault, the control input of NAND gate 116 is forced to low potential, so that its output carries high potential. Thus, both inputs of the NAND gate 110 carry high potential, so that flip-flop 110, 111 is reversed and the output of NAND gate 110 carries low potential, whereupon transistor 109 is blocked and relay 39 drops out. Normal operation can then continue.

Additionally the output of EXCLUSIVE-OR gate 37 is connected across a resistor 107 to the base of transistor 109. As soon as in the case of the aforementioned faults the EXCLUSIVE-OR gate 37 is gated, its positive output potential passes across resistor 107 to the base of transistor 109, so that the latter is again gated and relay 39 energized.

A further self-holding function for relay 39 is provided by switch 40 operated by it. This switch is also located in the ground feedline to relay 39. If relay 39 has pulled up, either across switches 90 or 91 or across transistor 109, switch 40 is also reversed. This self-holding function is only rendered ineffective through the switching over of switch 74 during a resetting process.

For controlling the (yellow) LED 33 the following circuit parts are provided. A parallel connection of a resistor 112 and a capacitor 113 is connected to the control input of NAND gate 111, the other terminal of said parallel connection being connected across a line to LED 33 and simultaneously across a series connection of switches 31, 35 to ground. As soon as one or both switches 31, 35 are opened, positive potential is applied to one terminal of the LED across resistors 116 and 112—its other connection also being at supply voltage. It therefore does not light up. Only when both switches 31, 35 are closed, is the ground connection formed, so that the LED lights up again. As both of these switches are associated with relay 30 or 34, they are only closed in the case of trouble free operation. With respect to the control input of NAND gate 111, in the case of closed switches 94, 95 and 31, 35, resistors 114 and 112 are parallel to one another, said parallel connection forming a voltage divider together with resistor 116. By dimensioning these resistors it is possible to fix the trigger voltage for NAND gate 111 in such a way that said gate is only switched over if all four switches 94, 95, 31, 35 are closed.

Figure 6:
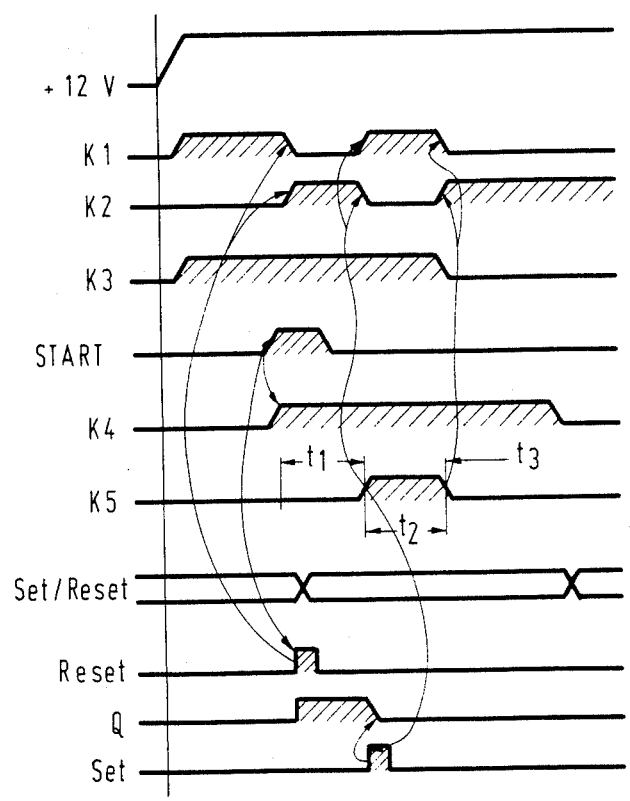
FIG. 6 is a pulse diagram illustrating the time sequence of switching of the resetting circuit relay of FIG. 5.

FIG. 6 shows the time patterns of the switching states of the individual relays and, on the basis of FIG. 7, the following association applies: relay 30: K1, relay 34: K2, relay 39: K3, relay 54: K4 and relay 55: K5. In the case of a fault K1 and K3 are energized and K2 dropped out. By depressing resetting key 66 (FIG. 5) K4 is energized and the resetting signal "reset" is produced (switch 74, FIG. 7). Delayed by $t_1$, K5 is energized, so that the power supply for the transmitter is disconnected. As soon as K5 drops out again, the transmitter is again supplied with power. Counters 11, 12 and flip-flops 15, 16 are already reset, so that then normal operation can commence, K1 and K3 being dropped out and K2 energized.

While the fundamental novel features of the invention have been shown and described and pointed out, it will be understood that various substitutions and changes in the form of the details of the embodiments shown may be made by those skilled in the art without departing from the concepts of the invention as limited only by the scope of the claims which follow.

What is claimed is:

1. In combination with a system utilizing a plurality of individual transmitters of light, a like plurality of individual receivers of light, a like plurality of light conducting paths whereby each transmitter is connected to its corresponding receiver by a corresponding path so that the light emitted by any transmitter can only impinge upon the corresponding receiver, the light emitted being in the form of pulses, the transmitters being selectively actuated and deactuated in selected format by a multiplexer, the corresponding receivers being synchronized to respond in the same format by a demultiplexer whereby when the system functions properly each receiver will receive and respond only to the light pulse emitted by the corresponding transmitter, an evaluation circuit comprising:
   first means for initiating a measuring operation in which each transmitter-receiver pair is individually actuated in a selected sequence;
   a first channel for producing a first signal when each receiver has properly received a light pulse emitted by its corresponding transmitter, the first signal suddenly changing value whenever a receiver fails to receive a light pulse emitted by its corresponding transmitter;
   second means for initiating a testing operation in which each transmitter-receiver pair is individually actuated in the same sequence but in such manner that each receiver will not receive any light pulse emitted by its corresponding transmitter;
   a second channel for producing a second signal when each receiver has not received any light pulse, the second signal suddenly changing value whenever a receiver receives a light pulse; and
   a third channel for monitoring the response of said first and second channels, the third channel increasing the response sensitivity of the first channel when the first signal changes value and increasing the response sensitivity of the second channel when the second signal changes value.

2. The combination of claim 1 wherein the measuring and testing operations are carried out in a cyclically alternating manner.

3. The combination of claim 2 wherein the input signals to the channels are in the form of electrical pulses, wherein each channel has up and down integrators which integrate input pulses into output analog signals, each of the first and second channels has a comparator which receives as an input the output signals from the corresponding integrator, and the output signals from the integrator in the third channel provides a reference value input to each of the comparators in the first and second channels.

4. The combination of claim 1 wherein the first and second signals are each the inverse of the other.

5. The combination of claim 1 further including first and second relays which are controlled by the first and second signals respectively, one relay being energized the other relay being deenergized when the first and second signals do not suddenly change values.

6. The combination of claim 1 further including an electrically powered unit which is monitored by the system and which is disabled when operation of the third channel does not eliminate faults detected during the measuring and testing operations.

7. The combination of claim 6 further including a resetting control means which must be manually operated to enable the unit after it has been disabled and the detected faults corrected.

8. The combination of claim 7 further including means in the evaluation circuit for disabling the unit.

9. The combination of claim 5 further including a third relay connected to an electrically operated unit and responsive to the deenergized state of the first relay and the energized state of the second relay to disable said unit.

10. The combination of claim 9 further including a resetting control operated manually by the key of an operator for causing said third relay to respond to the energized state of the first relay and the deenergized state of the second relay to energize the unit.

* * * * *

UNITED STATES PATENT AND TRADEMARK OFFICE
CERTIFICATE OF CORRECTION

PATENT NO. : 4,749,853
DATED : June 7, 1988
INVENTOR(S) : E. SALIM

It is certified that error appears in the above-identified patent and that said Letters Patent is hereby corrected as shown below:

Col. 3, line 55, change "inverting" to --non-inverting--;

Col. 7, line 31, change "8" to --8'--;

Col. 7, line 48, change "Q" to --$\bar{Q}$--;

Col. 8, line 40, change "$\bar{F}$" to --F--;

Col. 8, line 49, delete "16";

Col. 9, line 46, change "58" to --57--;

Col. 10, line 23, change "92" to --62--;

Col. 12, line 3, change "104" to --105--

Signed and Sealed this

Eighth Day of November, 1988

Attest:

DONALD J. QUIGG

Attesting Officer

Commissioner of Patents and Trademarks